United States Patent
Lien et al.

(10) Patent No.: US 7,852,673 B2
(45) Date of Patent: Dec. 14, 2010

(54) METHOD FOR OPERATING NONVOLATITLE MEMORY ARRAY

(75) Inventors: Hao-Ming Lien, Hsinchu (TW); Ming-Hsiu Lee, Hsinchu (TW)

(73) Assignee: MACRONIX International Co., Ltd, Hsinchu (TW)

(*) Notice: Subject to any disclaimer, the term of this patent is extended or adjusted under 35 U.S.C. 154(b) by 0 days.

(21) Appl. No.: 12/561,849

(22) Filed: Sep. 17, 2009

(65) Prior Publication Data
US 2010/0008153 A1    Jan. 14, 2010

Related U.S. Application Data

(62) Division of application No. 11/530,585, filed on Sep. 11, 2006, now abandoned.

(30) Foreign Application Priority Data
Jun. 14, 2006    (TW) .............................. 95121186 A

(51) Int. Cl.
*G11C 11/34* (2006.01)
(52) U.S. Cl. ............... 365/185.03; 365/63; 365/185.28; 365/185.29
(58) Field of Classification Search .................... 365/63, 365/185.03, 185.28, 185.29
See application file for complete search history.

(56) References Cited

U.S. PATENT DOCUMENTS

| 4,947,221 | A | * | 8/1990 | Stewart et al. | ............... 257/316 |
| 5,550,772 | A | * | 8/1996 | Gill | ....................... 365/185.03 |
| 6,541,816 | B2 | | 4/2003 | Ramsbey et al. | ............ 257/324 |
| 6,720,614 | B2 | * | 4/2004 | Lin et al. | ..................... 257/316 |
| 2004/0108540 | A1 | * | 6/2004 | Yoshino | ...................... 257/315 |

FOREIGN PATENT DOCUMENTS

CN        1407614 A    *    4/2003

OTHER PUBLICATIONS

Chinese Third Examination Report of China Patent Application No. 200610090497.6 dated Mar. 9, 2010.

* cited by examiner

*Primary Examiner*—Dang T Nguyen
*Assistant Examiner*—Alexander Sofocleous
(74) *Attorney, Agent, or Firm*—J.C. Patents

(57) ABSTRACT

A method for programming a mixed nonvolatile memory array having a plurality of mixed memory cells, wherein each mixed memory cell includes a depletion mode memory cell and an enhanced mode memory cell. The method comprises steps of programming the enhanced mode memory cell in a way of channel hot carrier and programming the depletion mode memory cell in a way of band-to-band tunneling hot carrier.

14 Claims, 8 Drawing Sheets

METHOD FOR OPERATING NONVOLATITLE MEMORY ARRAY

CROSS-REFERENCE TO RELATED APPLICATION

This application is a divisional application of and claims the priority benefit of U.S. application Ser. No. 11/530,585, filed on Sep. 11, 2006, now pending, which claims the priority benefit of Taiwan application serial no. 95121186, filed on Jun. 14, 2006. The entirety of each of the above-mentioned patent applications is hereby incorporated by reference herein and made a part of this specification.

BACKGROUND OF THE INVENTION

1. Field of Invention

The present invention relates to a method for operating a nonvolatile memory array. More particularly, the present invention relates to a method for operating a mixed nonvolatile memory array.

2. Description of Related Art

Among the various types of non-volatile memory products, electrically erasable programmable read only memory (EEPROM) is a memory device that has been widely used inside personal computer systems and electron equipment. Data can be stored, read out or erased from the EEPROM many times and stored data are retained even after power supplying the devices is cut off.

Typically, the floating gates and the control gates of the EEPROM non-volatile memory are fabricated using doped polysilicon. When data is programmed into the memory, the electrons injected into the floating gate will be evenly distributed throughout the entire polysilicon floating gate layer. However, if the tunneling oxide layer underneath the polysilicon gate contains some defects, a leakage current may develop leading to possible reliability problems in the device.

To prevent problems in operating the EEPROM due to leakage current, the conventional method is to use a charge-trapping layer instead of the polysilicon floating gate. The charge-trapping layer is fabricated using silicon nitride, for example. In general, the silicon nitride charge-trapping layer is sandwiched between a silicon oxide layer on top and another silicon oxide layer below to form an oxide/nitride/oxide (ONO) composite dielectric layer within a stack gate structure. An EEPROM having this type of stack gate structure is known as a nitride read-only-memory.

However, in the conventional technique, after the gate structure is formed, an ion implantation process is performed to form source/drain region in a portion of the substrate exposed by the gate structure. Hence, the production cost is increased beside the addition of one more ion implantation process. Furthermore, in a two-time-feature-size square region, the unit memory device only provides two carrier storage space.

Hence, it is important to find a method capable of increasing the carrier storage density in the unit nonvolatile memory device and reducing the cost for manufacturing the nonvolatile memory device.

SUMMARY OF THE INVENTION

The present invention further provides a method for programming a mixed nonvolatile memory array having a plurality of mixed memory cells, wherein each mixed memory cell includes a first doped region of a second conductive type and a second doped region of the second conductive type located in a substrate of a first conductive type and parallel to and adjacent to each other. Each memory cell further includes a gate structure located on the substrate and across the first doped region and the second doped region. The first doped region and the gate structure together form a depletion mode memory cell and the first doped region, the second doped region and the first gate structure together form an enhanced mode memory cell. The method comprises steps of applying a first voltage on the gate structure to turn on a channel region in the substrate under the gate structure between the first doped region and the second doped region and applying a first bias on the first doped region and the second doped region to inject a plurality of electrons into the gate structures in a way of channel hot carrier during the enhanced mode memory cell is programmed. Further, during the depletion mode memory cell is programmed, a second voltage is applied on the gate structure to invert a conductive type of a portion of the first doped region under the gate structure from the second conductive type into the first conductive type and a second bias is applied on the first doped region to inject a plurality of holes into the gate structures in a way of band-to-band tunneling hot carrier.

In programming method according to one embodiment of the present invention, a thickness of the first doped region is of about 200 angstroms and a thickness of the second doped region is of about 200 angstroms. When the first conductive type is P type and the second conductive type is N type, the channel hot carrier includes a channel hot electron process and the band-to-band tunneling hot carrier includes a band-to-band tunneling hot hole process. Also, the gate structure comprises a multi-carrier storage element located on the substrate and a gate located on the multi-carrier storage element. The multi-carrier storage element includes an oxide/nitride/oxide layer.

The present invention further provides a method for reading a mixed nonvolatile memory array having a plurality of mixed memory cells, wherein each mixed memory cell includes a first doped region of a second conductive type and a second doped region of the second conductive type located in a substrate of a first conductive type and parallel to and adjacent to each other. Each memory cell further includes a gate structure located on the substrate and across the first doped region and the second doped region. The first doped region and the gate structure together form a depletion mode memory cell and the first doped region, the second doped region and the first gate structure together form an enhanced mode memory cell. The method comprises steps of applying a first voltage on the gate structure to turn on a channel region in the substrate under the gate structure between the first doped region and the second doped region and applying a first bias between the first doped region and the second doped region to read the enhanced mode memory cell in a way of reverse read during the enhanced mode memory cell is read. Furthermore, during the depletion mode memory cell is read, a second voltage is applied on the gate structure to invert a conductive type of a portion of the first doped region under the gate structure from the second conductive type into the first conductive type and applying a second bias on the first doped region to read the depletion mode in the way of reverse read.

In the reading method according to one embodiment of the present invention, a thickness of the first doped region is of about 200 angstroms and a thickness of the second doped region is of about 200 angstroms. In addition, the gate structure comprises a multi-carrier storage element located on the substrate and a gate located on the multi-carrier storage element, wherein the multi-carrier storage element includes an oxide/nitride/oxide layer.

The present invention further provides a method for erasing a mixed nonvolatile memory array having a plurality of mixed memory cells, wherein each memory cell includes a first doped region of a second conductive type and a second doped region of the second conductive type located in a substrate of a first conductive type and parallel to and adjacent to each other. Each memory cell further includes a gate structure located on the substrate and across the first doped region and the second doped region. The first doped region and the gate structure together form a depletion mode memory cell and the first doped region, the second doped region and the first gate structure together form an enhanced mode memory cell. The method comprises steps of applying a first voltage on the gate structure and grounding the first doped region and the second doped region to erase the enhanced mode memory cell in a way of Fowler-Nordheim tunneling effect during the enhanced mode memory cell is erased. Furthermore, a second voltage is applied on the gate structure and grounding the first doped region to erase the depletion mode in the way of Fowler-Nordheim tunneling effect during the depletion mode memory cell is erased. When the enhanced mode memory cell and the depletion mode memory cell are erased at the same time, the first voltage is equal to the second voltage.

In the erasing method according to one embodiment of the present invention, a thickness of the first doped region is of about 200 angstroms and a thickness of the second doped region is of about 200 angstroms. In addition, the gate structure comprises a multi-carrier storage element located on the substrate and a gate located on the multi-carrier storage element, wherein the multi-carrier storage element includes an oxide/nitride/oxide layer.

Since the oxide/nitride/oxide layer is used as a carrier trapping element and the doped region with a relatively small thickness is used as source/drain region and the channel region between the source/drain regions, the manufacturing method is relatively simple and the cost is decreased as well. Furthermore, there are at least four carrier storage spaces in a two-feature size square region so that the carrier storage density is increased. By comparing with the conventional nitride read-only memory, the mixed nonvolatile memory array of the present invention does not need a buried diffusion oxide layer structure, and the oxide/nitride/oxide layer under the gate is completely remained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
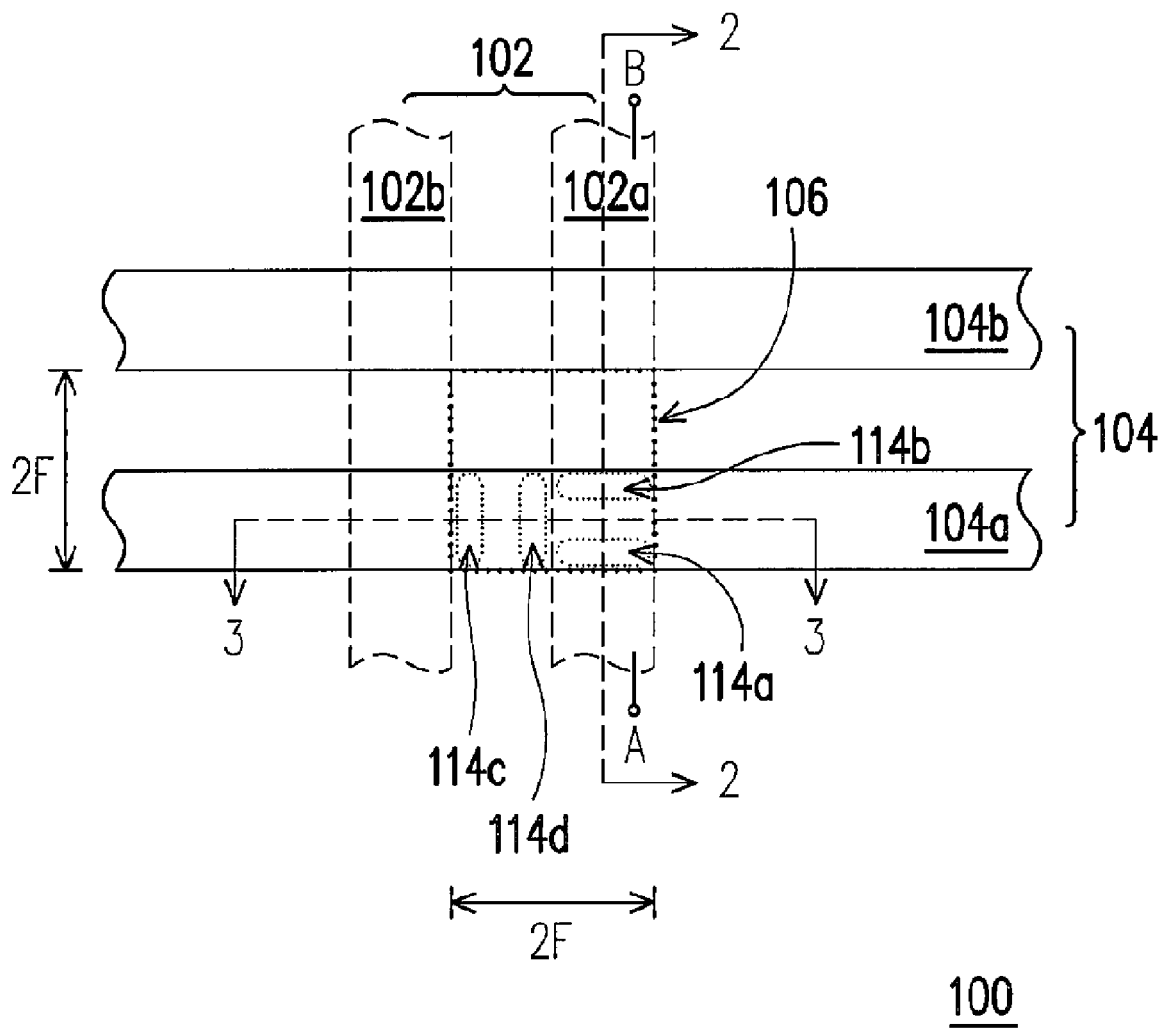
FIG. 1 is a top view showing a mixed nonvolatile memory array according to one embodiment of the present invention.
Figure 2:
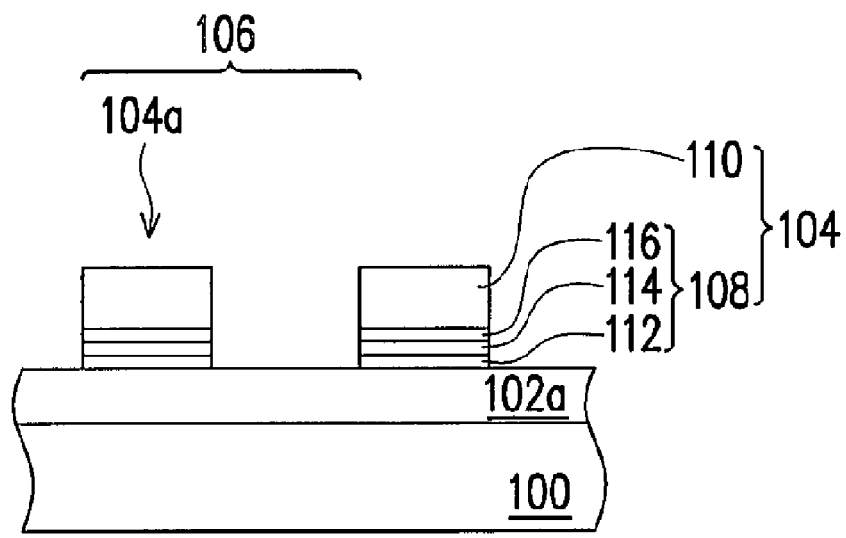
FIG. 2 is a cross-sectional view along a line 2-2 of a mixed nonvolatile memory array according to one embodiment of the present invention.
Figure 3:
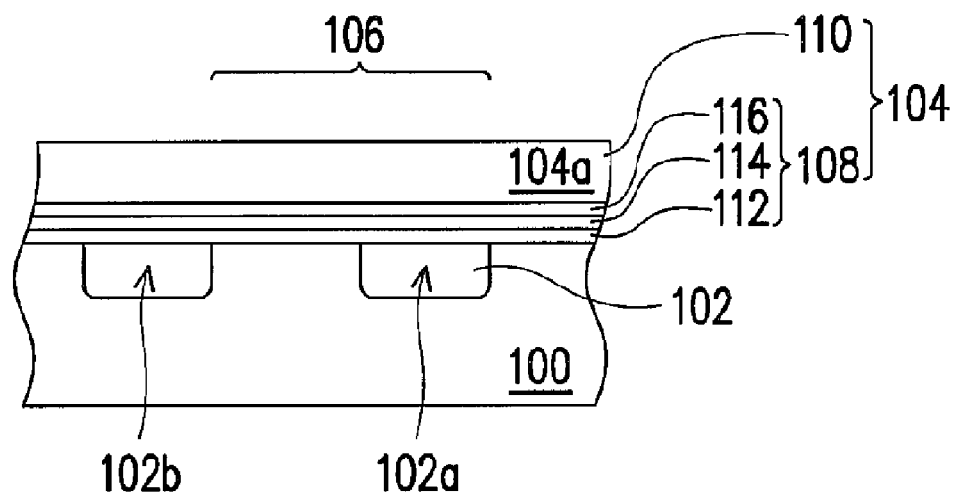
FIG. 3 is a cross-sectional view along a line 3-3 of a mixed nonvolatile memory array according to one embodiment of the present invention.

FIG. 1 is a top view showing a mixed nonvolatile memory array according to one embodiment of the present invention. FIG. 2 is a cross-sectional view along a line 2-2 of a mixed nonvolatile memory array according to one embodiment of the present invention. FIG. 3 is a cross-sectional view along a line 3-3 of a mixed nonvolatile memory array according to one embodiment of the present invention. As shown in FIGS. 1, 2 and 3, at least two parallel doped regions 102 are positioned in a substrate 100. The doped regions 102 include a first doped region 102a and a second doped region 102b. The substrate 100 can be a substrate having a first conductive type or a silicon-on-insulator substrate.

In addition, the doped regions 102 including the first doped region 102a and the second doped region 102b have a second conductive type. The doped regions 102 extend from a top surface of the substrate 100 toward to a bottom of the substrate 100. The thickness of the doped regions 102 can be about 200 angstroms, for example. Furthermore, the doped regions 102 are separated from each other. Moreover, the doped regions 102 can be, for example, buried bit lines. Further, when the first conductive type is P type, the second conductive type is N type; when the first conductive type is N type, the second conductive type is P type.

As shown in FIGS. 1, 2 and 3, at least one gate structure 104 comprising a first gate structure 104a and a second gate structure 104b is positioned on the substrate 100 and across the doped regions 102. The first gate structure 104a and the second gate structure 104b are parallel to each other and each gate structure 104 includes a multi-carrier storage element 108 located on the substrate 100 and a gate 110 located on the multi-carrier storage element 108. Moreover, the multi-carrier storage element 108 can be, for example, an oxide/nitride/oxide layer which is a stacked layer formed by stacking an oxide layer 112, a nitride layer 114 and an oxide layer 116 on the substrate 100 sequentially. Further, the nitride layer 114 is used as an electron or hole trapping element in the operations of the nonvolatile memory array.

As shown in FIG. 1, a two-feature-size square ($4F^2$) region 106 is circled by bold-dotted line, wherein the feature size is half of a smallest device pitch. In the nonvolatile memory array of the present embodiment of the invention, the gate pitch of the gate structure is smaller than or equal to double feature size. Furthermore, the mixed type nonvolatile memory array of the present embodiment possesses a plurality of $4F^2$ regions 106 and each $4F^2$ region 106 includes at least one nonvolatile memory cell.

In addition, each nonvolatile memory cell includes at least one depletion mode memory cell. As shown in FIG. 2, taking a nonvolatile memory cell in the $4F^2$ region 106 as an example, the depletion mode memory cell is composed of the first doped region 102a and the first gate structure 104a. Also, as shown in FIG. 1, the depletion mode memory cell composed of the first doped region 102a and the first gate structure 104 comprises at least a third carrier storage space 114a and a fourth carrier storage space 114b located at both sides of the multi-carrier storage element 108 and adjacent to the first doped region 102a respectively.

Moreover, every nonvolatile memory cell further comprises an enhanced mode memory cell. As shown in FIG. 3, taking a nonvolatile memory cell in the $4F^2$ region 106 as an example, the enhanced mode memory cell is composed of the first gate structure 104a, a portion of the first doped region 102a covered by the first gate structure 104a and a portion of the second doped region 102b covered by the first gate structure 104a.

Therefore, when a nonvolatile memory cell comprises both an enhanced mode memory cell and a depletion mode memory cell, the nonvolatile memory cell is a mixed type nonvolatile memory cell. By comparing with the conventional nitride read-only memory, the aforementioned mixed nonvolatile memory array does not need a buried diffusion oxide layer structure, and the oxide/nitride/oxide layer under the gate is remained. That is, there is no conventional buried diffusion oxide layer structure above the substrate 100 and the gate structure 104 possesses a complete multi-carrier storage element 108.

Figure 4A:
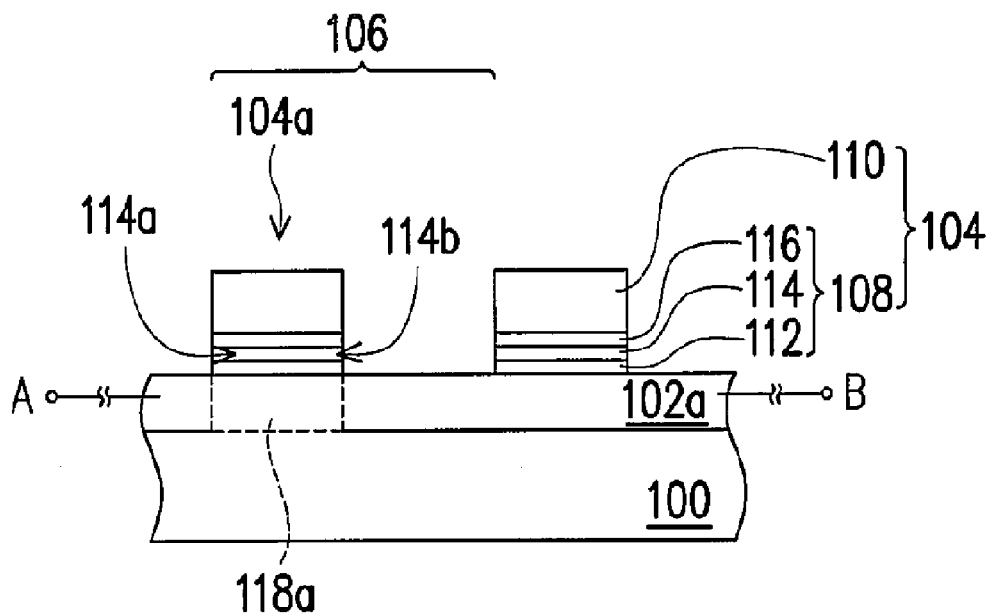
FIG. 4A is a cross-sectional view a depletion mode memory cell of a mixed nonvolatile memory array during a programming process is performed on the depletion mode memory cell according to one embodiment of the present invention.

FIG. 4A is a cross-sectional view a depletion mode memory cell of a mixed nonvolatile memory array during a programming process is performed on the depletion mode memory cell according to one embodiment of the present invention. As shown in FIGS. 1 and 2, when there is no operation is performed on the depletion mode memory cell of a nonvolatile memory cell in the $4F^2$ region 106, the channel region in the substrate 100 under the first gate structure 104a is in a turn on situation normally. Referring to FIG. 1 together with FIG. 4A, during the depletion mode memory cell of the nonvolatile memory cell is programmed, a voltage is applied on the first gate structure 104a to invert a portion of the first doped region 102a having the second conductive type and covered by the first gate structure 104a into a doped region 118a, which is the inversion region 118a, with the first conductive type. That is, the channel region in the substrate 100 under the first gate structure 104a is turned off. Simultaneously, a bias is applied on the first doped region 102a to program the depletion mode memory cell.

Preferably, when the first doped region 102a is an N type doped region, a second voltage is applied on the first gate structure 104a to invert the portion of the doped region 102a under the first gate structure 104a into the doped region 118a with P conductive type, wherein the second voltage is of about −7 volt. Meanwhile, a second bias is applied on an A terminal and a B terminal of the first doped region 102a. The second bias applied on the A terminal and the B terminal of the first doped region 102a can be accomplished by applying a 5 volt on the A terminal and grounding the B terminal. By applying the second bias on the first doped region 102a, a programming process in a way of band-to-band tunneling hot carrier, such as the band-to-band tunneling hot hole process, is triggered so as to inject holes from the first doped region 102a into a third carrier storage space 114a in a portion of the multi-carrier storage element 108 in the first gate structure 104a near to the A terminal. Hence, the threshold voltage at the third carrier storage space 114a is decreased from −2 volt to −5 volt. On the other hand, when the second voltage applied on the first gate structure 104a is fixed, the A terminal is grounded and a 5 volt is applied on the B terminal, the programming process in a way of band-to-band tunneling hot hole is triggered to inject holes from the first doped region 102a into a fourth carrier storage space 114b in a portion of the multi-carrier storage element 108 in the first gate structure 104a near to the B terminal. Therefore, the threshold voltage at the fourth carrier storage space 114b is decreased from −2 volt to −5 volt. Although the programming process in a way of band-to-band tunneling hot hole is recited above, the other programming process can be also applied to program the depletion mode memory cell by applying proper voltages on the first gate structure 104a and the first doped region 102a.

Figure 4B:
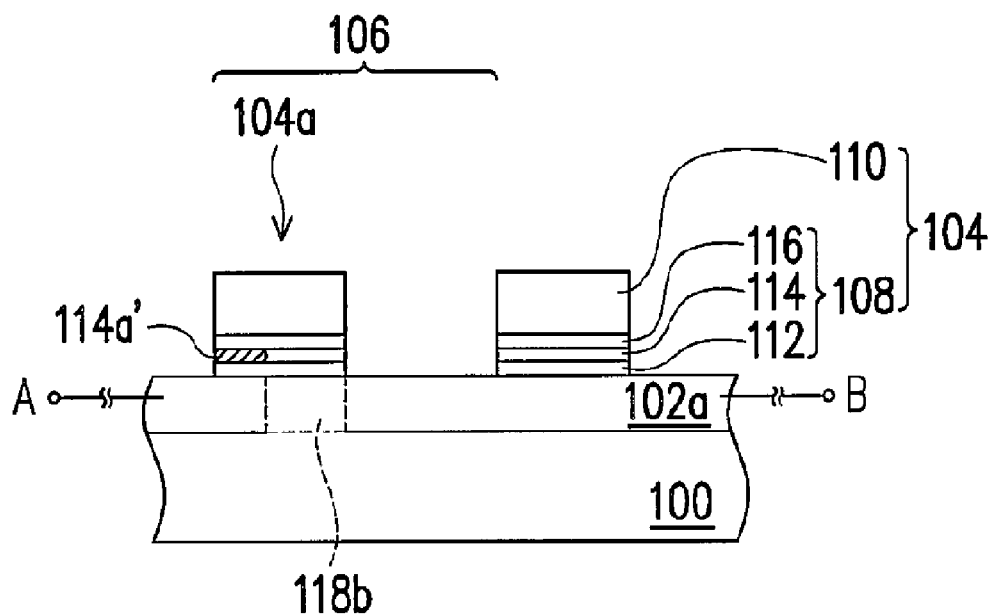
FIG. 4B is a cross-sectional view a depletion mode memory cell of a mixed nonvolatile memory array during a reading process is performed on the depletion mode memory cell according to one embodiment of the present invention.

FIG. 4B is a cross-sectional view a depletion mode memory cell of a mixed nonvolatile memory array during a reading process is performed on the depletion mode memory cell according to one embodiment of the present invention. Referring to FIG. 1 together with FIG. 4B, during a reading process is performed on the depletion mode memory cell having the third carrier storage space 114a storing holes 114a', a voltage is applied on the first gate structure 104a. Therefore, a portion of the first doped region 102a directly under the third carrier storage space 114a and a portion of the first doped region 102a exposed by the first gate structure 104a still possess the second conductive type but the rest portion of the first doped region 102a is converted into a doped region 118b, which is an inversion region, with the first conductive type. In other words, when this depletion mode memory cell is at a carrier storage state, the so-called on state, the conductive type of the portion of the first doped region 102a right under the first gate structure 104a is inverted from the second conductive type into the first conductive type. That is, an inversion region is formed in the first doped region right under a portion of the first gate structure. On the other words, the channel region in the substrate 100 under the first gate structure 104a is partially turned off. Simultaneously, a bias is applied on the first doped region 102a to read the depletion mode memory cell.

Preferably, when the first doped region 102a is an N type doped region, a third voltage is applied on the first gate structure 104a to invert the portion of the doped region 102a under the first gate structure 104a into the doped region 118a with P conductive type, wherein the third voltage can be in a range from −2 volt to −5 volt and the preferred value of the third voltage is of about −3 volt. Meanwhile, a bias is applied on the A terminal and the B terminal of the first doped region 102a. The bias applied on the A terminal and the B terminal of the first doped region 102a can be accomplished by applying a 2 volt on the B terminal and grounding the A terminal. By applying the bias on the first doped region 102a, a reading process in a way of reverse read is triggered to read the third carrier storage space 114a' of this depletion mode memory cell. Although the reading process in a way of reverse read is recited above, the other reading process such as forward reading process can be also applied to read the depletion mode memory cell by applying proper voltages on the first gate structure 104a and the first doped region 102a.

Alternatively, under the circumstance that there is no carrier stored in the multi-carrier storage element, during a reading process is performed on the depletion mode memory cell, by applying a voltage on the gate structure, the conductive type of the portion of the doped region covered by the gate structure is converted from the second conductive type into the first conductive type. That is, an inversion region is formed in the first doped region 102a right under the first gate structure. On the other words, under the situation that the depletion mode memory cell is at a non-carrier storage state, the so-called off state, the channel region in the substrate under the first gate structure is totally turned off during the reading process is performed on the depletion mode memory cell.

Figure 4C:
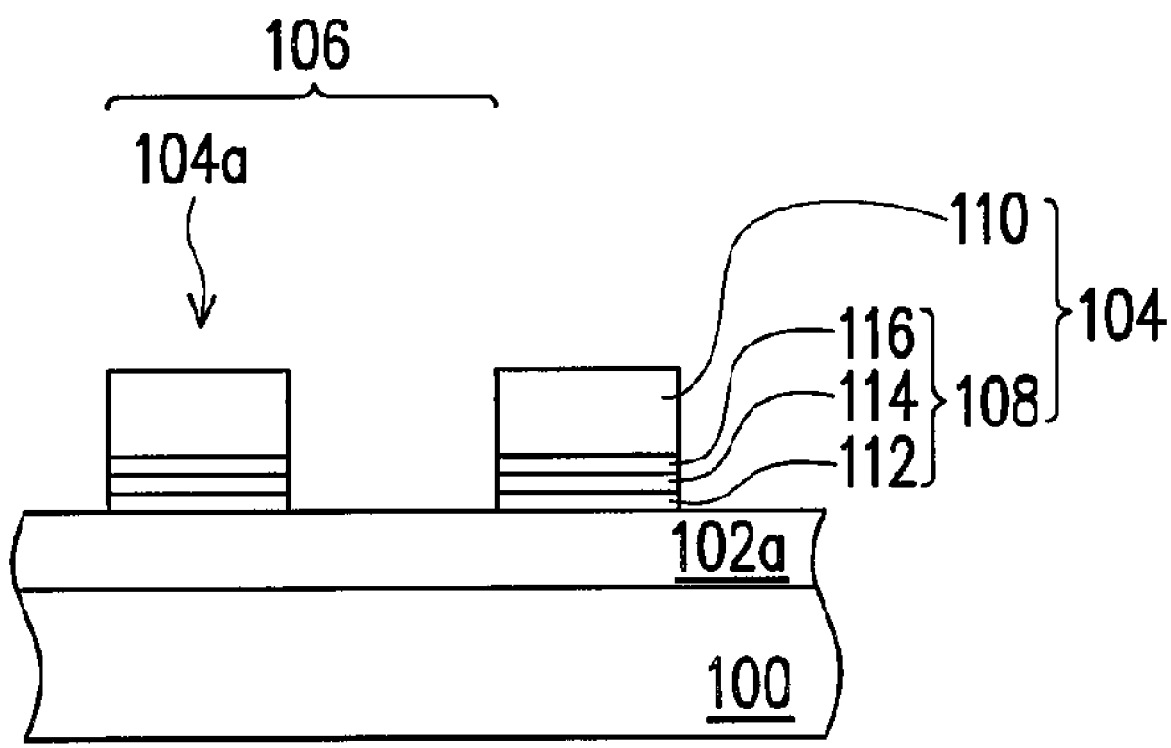
FIG. 4C is a cross-sectional view a depletion mode memory cell of a mixed nonvolatile memory array during an erasing process is performed on the depletion mode memory cell according to one embodiment of the present invention.

FIG. 4C is a cross-sectional view a depletion mode memory cell of a mixed nonvolatile memory array during an erasing process is performed on the depletion mode memory cell according to one embodiment of the present invention. Referring to FIG. 1 together with FIG. 4C, during an erasing process is performed on the depletion mode memory cell, a voltage is applied on the first gate structure 104a and both the A terminal and the B terminal of the first doped region 102a are grounded.

Preferably, when the first doped region 102a is an N type doped region, a fourth voltage is applied on the first gate structure 104a and both the A terminal and the B terminal of the doped region 102a are grounded, wherein the fourth voltage can be −20. By applying the fourth voltage on the first gate structure 104a and grounding the first doped region 102a, an erasing process in a way of Fowler-Nordheim tunneling effect is triggered. Hence, the threshold voltage of the depletion mode memory cell is increased from −5 volt to −2 volt. Notably, the conductive type of the portion of the first doped region 102 covered by the first gate structure 104a is inverted from the second conductive type into the first conductive type by applying the fourth voltage on the first gate structure 104a. Although the erasing process in a way of Fowler-Nordheim tunneling effect is recited above, the other erasing process can be also applied on the depletion mode memory cell by applying proper voltages on the first gate structure 104a and the first doped region 102a.

Figure 5A:
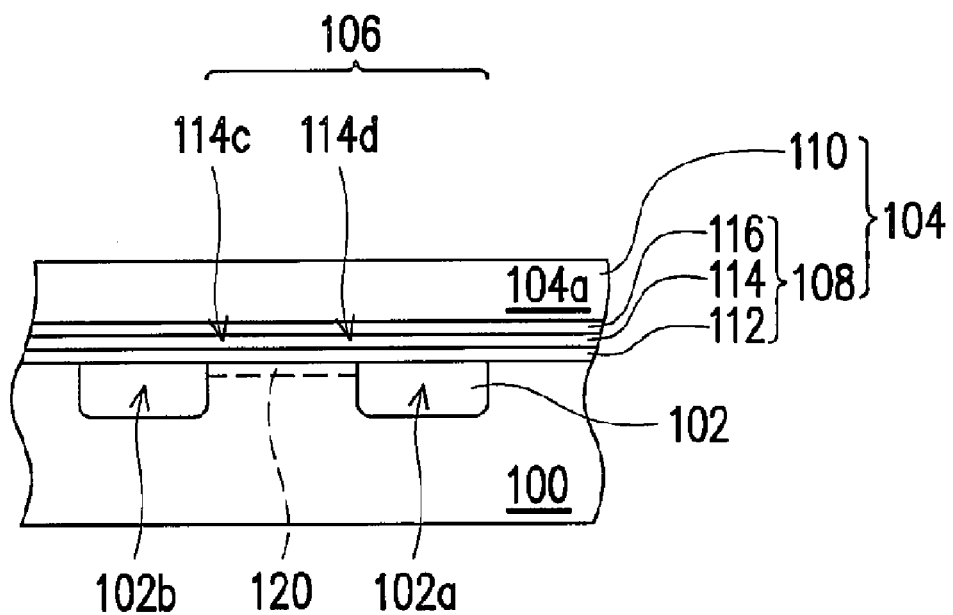
FIG. 5A is a cross-sectional view an enhanced mode memory cell of a mixed nonvolatile memory array during a programming process is performed on the enhanced mode memory cell according to one embodiment of the present invention.

FIG. 5A is a cross-sectional view a enhanced mode memory cell of a mixed nonvolatile memory array during a programming process is performed on the enhanced mode memory cell according to one embodiment of the present invention. As shown in FIGS. 1 and 3, when there is no operation is performed on the enhanced mode memory cell of a nonvolatile memory cell in the 4F² region 106, the channel region in the substrate 100 under the first gate structure 104a between the first doped region 102a and the second doped region 102b is in a turn off situation normally. That is, the conductive type of the channel region is the first conductive type. Referring to FIG. 1 together with FIG. 5A, during the enhanced mode memory cell of the nonvolatile memory cell is programmed, a voltage is applied on the first gate structure 104a to invert the channel region having the first conductive type into a channel region 120 with the second conductive type. That is, the channel region in the substrate 100 under the first gate structure 104a between the first doped region 102a and the second doped region 102b is turned on. Simultaneously, a bias is applied between the first doped region 102a and the second doped region 102b to program the enhanced mode memory cell.

Preferably, when the first doped region 102a and the second doped region 102a are both the N type doped regions, a first voltage of about 12 volt is applied on the first gate structure 104a, a fifth voltage of about 5 volt is applied on the first doped region 102a and a sixth voltage of about 0 volt is applied on the second doped region 102b. Therefore, a programming process in a way of channel hot carrier, such as a channel hot electron process, is triggered so as to inject electrons from the second doped region 102b (i.e. source region) into a second carrier storage space 114d in a portion of the multi-carrier storage element 108 in the first gate structure 104a between the first doped region 102a and the second doped region 102b and near the first doped region 102a (i.e. drain region). Hence, the threshold voltage at the second carrier storage space 114d is increased from 6 volt to 9 volt. On the other hand, when the first voltage applied on the first gate structure 104a is fixed, the fifth voltage is of about 0 volt and the sixth voltage is of about 5 volt, the programming process in a way of channel hot electron is triggered to inject electrons from the first doped region 102a (i.e. source region) into a first carrier storage space 114c in a portion of the multi-carrier storage element 108 in the first gate structure 104a between the first doped region 102a and the second doped region 102b and near the second doped region 102b (i.e. drain region). Therefore, the threshold voltage at the first carrier storage space 114c is increased from 6 volt to 9 volt. Although the programming process in a way of channel hot electron is recited above, the other programming process can be also applied to program the enhanced mode memory cell by applying proper voltages on the first gate structure 104a, the first doped region 102a and the second doped region 102b.

Figure 5B:
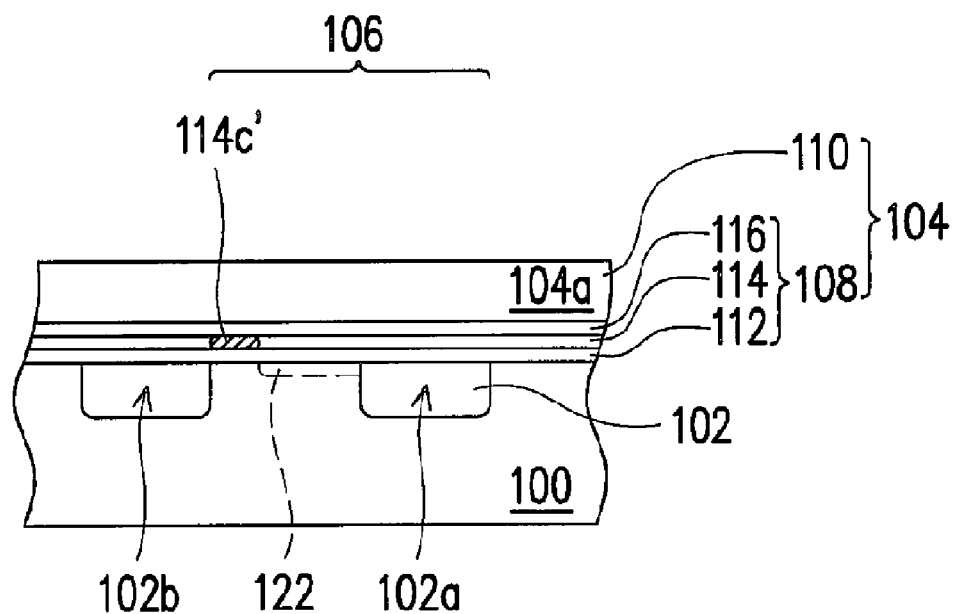
FIG. 5B is a cross-sectional view an enhanced mode memory cell of a mixed nonvolatile memory array during a reading process is performed on the enhanced mode memory cell according to one embodiment of the present invention.

FIG. 5B is a cross-sectional view a enhanced mode memory cell of a mixed nonvolatile memory array during a reading process is performed on the enhanced mode memory cell according to one embodiment of the present invention. Referring to FIG. 1 together with FIG. 5B, during a reading process is performed on the enhanced mode memory cell having the first carrier storage space 114c storing electrons 114c', a voltage is applied on the first gate structure 104a to turn on a channel region 122 with the second conductive type in the substrate 100 covered by the first gate structure 104a between the first doped region 102a and the second doped region 102b, wherein the channel region 122 is near the top surface of the substrate 100. Simultaneously, a bias is applied between the first doped region 102a and the second region 102b to read the enhanced mode memory cell.

Preferably, when the first doped region 102a and the second doped region 102a are both the N type doped regions, a seventh voltage, a eight voltage and a ninth voltage are applied on the first gate structure 104a, the first doped region 102a and the second doped region 102b respectively. Therefore, a reading process in a way of reverse read is triggered to read the first carrier storage space 114c' of this enhanced mode memory cell. Notably, the seventh voltage can be in a range from 6 volt to 9 volt and the preferred value of the seventh voltage is of about 8 volt. Furthermore, the eighth voltage is of about 2 volt and the ninth voltage is about of 0 volt. Although the reading process in a way of reverse read is recited above, the other reading process such as forward reading process can be also applied to read the enhanced mode memory cell by applying proper voltages on the first gate structure 104a, the first doped region 102a and the second doped region 102b.

Figure 5C:
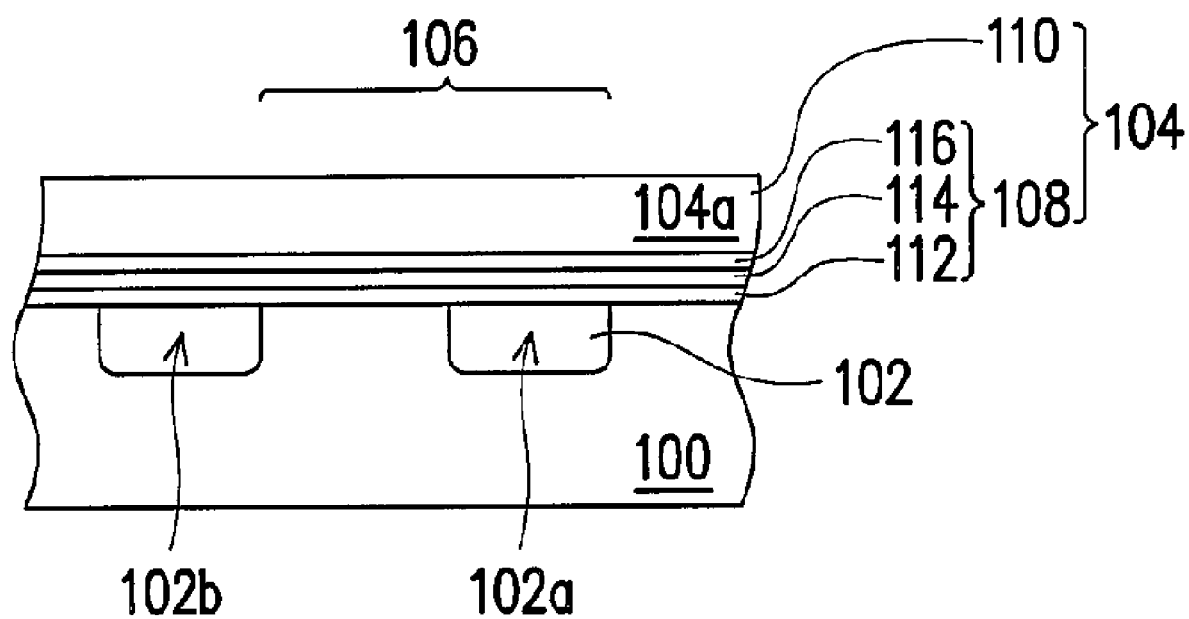
FIG. 5C is a cross-sectional view an enhanced mode memory cell of a mixed nonvolatile memory array during an erasing process is performed on the enhanced mode memory cell according to one embodiment of the present invention.

FIG. 5C is a cross-sectional view an enhanced mode memory cell of a mixed nonvolatile memory array during an erasing process is performed on the enhanced mode memory cell according to one embodiment of the present invention.

Referring to FIG. 1 together with FIG. 5C, during an erasing process is performed on the enhanced mode memory cell, a voltage is applied on the first gate structure 104a and both the first doped region 102a and the second doped region 102b are grounded.

Preferably, when the first doped region 102a and the second doped region 102a are both the N type doped regions, a tenth voltage of about −20 volt is applied on the first gate structure 104a and both the first doped region 102a and the second doped region 102b are grounded. By applying the tenth voltage on the first gate structure 104a and grounding the first doped region 102a and the second doped region 102b, an erasing process in a way of Fowler-Nordheim tunneling effect is triggered. Hence, the threshold voltage of the enhanced mode memory cell is decreased from 9 volt to 6 volt. Although the erasing process in a way of Fowler-Nordheim tunneling effect is recited above, the other erasing process can be also applied on the depletion mode memory cell by applying proper voltages on the first gate structure 104a, the first doped region 102a and the second doped region 102b.

In the embodiment described above, in every $4F^2$ region 106, there is at least one nonvolatile memory cell. As for each nonvolatile memory cell, there are at least one pair memory cell including a depletion mode memory cell and an enhanced mode memory cell. In addition, each of the depletion mode memory cell and the enhanced mode memory cell possesses two carrier storage spaces. In other words, for each $4F^2$ region 106, at least four bits can be stored therein.

Figure 6:
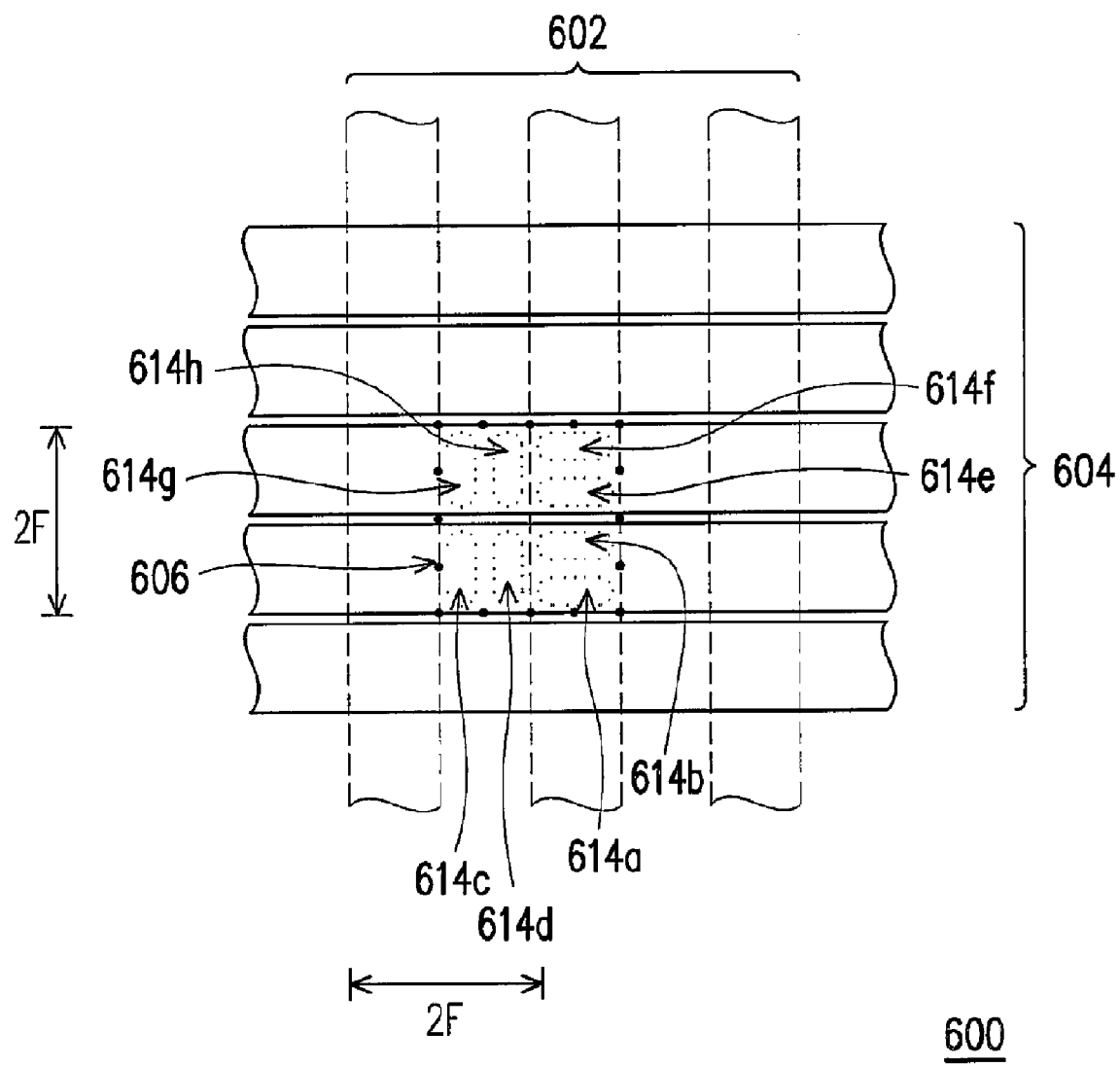
FIG. 6 is top view showing a mixed nonvolatile memory array according to another embodiment of the present invention.

FIG. 6 is top view showing a mixed nonvolatile memory array according to another embodiment of the present invention. As shown in FIG. 6, a similar gate structures are inserted in the gate space between each two gate structures 104 in the above embodiment so that the gate pitch of the gate structure 604 is smaller than or equal to one feature size F. Therefore, for each $4F^2$ region 606, there are at least two nonvolatile memory cells. That is, there are eight carrier storage spaces including space 614a, space 614b, space 614c, space 614d, space 614e, space 614f, space 614g and space 614h in a $4F^2$ region 606. More specifically, each $4F^2$ region 606 can store at most 8 bits.

Figure 7:
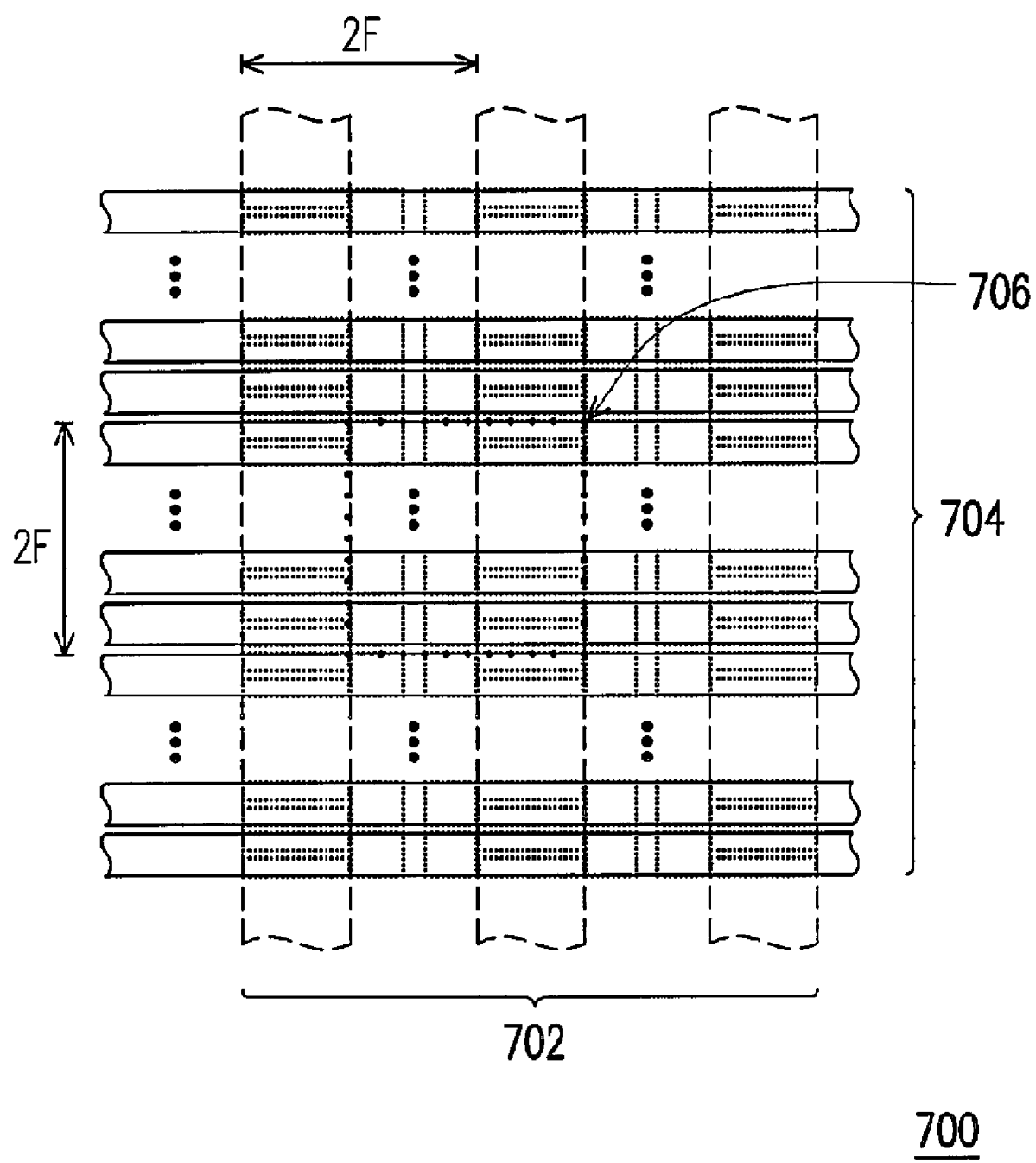
FIG. 7 is top view showing a mixed nonvolatile memory array according to the other embodiment of the present invention.

FIG. 7 is top view showing a mixed nonvolatile memory array according to the other embodiment of the present invention. As shown in FIG. 7, when there are n (where n is not less than 3) gate structures within a $4F^2$ region 706, there are 4n carrier storage spaces within the $4F^2$ region 706. That is, at most 4n bits can be stored in a single $4F^2$ region 706.

Altogether, in the present invention, the oxide/nitride/oxide layer is used as a carrier trapping element and the doped region with the relatively small thickness is used as the source/drain regions and the channel region of both the depletion mode memory cell and the enhanced mode memory cell. By applying the voltages on the gate structures and the doped regions, the conductive type of a portion of the doped region under the gate structure is exchanged to either turn on or turn off the channel between the source/drain regions. Therefore, there is no need to perform additional ion implantation process and gate patterning process so that the manufacturing cost is decreased. Furthermore, for each memory cell of the present invention, there are a depletion mode memory cell and an enhanced mode memory cell. Hence, the density of the carrier storage space is increased. That is, for each $4F^2$ region, there are at least four carrier storage spaces. Moreover, when there are n gate structures within a $4F^2$ region, the number of the carrier storage spaces is greatly increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for programming a nonvolatile memory array having a plurality of memory cells, wherein each memory cell includes a first doped region of a second conductive type and a second doped region of the second conductive type located in a substrate of a first conductive type and parallel to and adjacent to each other, each memory cell further includes a gate structure located on the substrate and across the first doped region and the second doped region, the first doped region and the gate structure together form a depletion mode memory cell and the first doped region, the second doped region and the first gate structure together form an enhanced mode memory cell, and method comprising:

during programming of the enhanced mode memory cell, applying a first voltage on the gate structure to turn on a channel region having the second conductive type in the substrate under the gate structure between the first doped region and the second doped region and applying a first bias between the first doped region and the second doped region to inject a plurality of electrons into the gate structures in a way of channel hot carrier; and during programming of the depletion mode memory cell, applying a second voltage on the gate structure to invert a conductive type of a portion of the first doped region under the gate structure from the second conductive type into the first conductive type and applying a second bias on the first doped region to inject a plurality of holes into the gate structures in a way of band-to-band tunneling hot carrier.

2. The method of claim 1, wherein a thickness of the first doped region is of about 200 angstroms and a thickness of the second doped region is of about 200 angstroms.

3. The method of claim 1, wherein when the first conductive type is P type and the second conductive type is N type, the channel hot carrier includes a channel hot electron process and the band-to-band tunneling hot carrier includes a band-to-band tunneling hot hole process.

4. The method of claim 1, wherein the gate structure comprises a multi-carrier storage element located on the substrate and a gate located on the multi-carrier storage element.

5. The method of claim 4, wherein the multi-carrier storage element includes an oxide/nitride/oxide layer.

6. A method for reading a nonvolatile memory array having a plurality of memory cells, wherein each memory cell includes a first doped region of a second conductive type and a second doped region of the second conductive type located in a substrate of a first conductive type and parallel to and adjacent to each other, each memory cell further includes a gate structure located on the substrate and across the first doped region and the second doped region, the first doped region and the gate structure together form a depletion mode memory cell and the first doped region, the second doped region and the first gate structure together form an enhanced mode memory cell, and method comprising:

during reading of the enhanced mode memory cell, applying a first voltage on the gate structure to turn on a channel region having the second conductive type in the substrate under the gate structure between the first doped region and the second doped region and applying a first bias between the first doped region and the second doped region to read the enhanced mode memory cell in a way of reverse read; and during reading of the depletion mode memory cell, applying a second voltage on the gate structure to invert a conductive type of a portion of the first doped region under the gate structure from the second conductive type into the first conductive type and applying a second bias on the first doped region to read the depletion mode in the way of reverse read.

7. The method of claim 6, wherein a thickness of the first doped region is of about 200 angstroms and a thickness of the second doped region is of about 200 angstroms.

8. The method of claim 6, wherein the gate structure comprises a multi-carrier storage element located on the substrate and a gate located on the multi-carrier storage element.

9. The method of claim 8, wherein the multi-carrier storage element includes an oxide/nitride/oxide layer.

10. A method for erasing a nonvolatile memory array having a plurality of memory cells, wherein each memory cell includes a first doped region of a second conductive type and a second doped region of the second conductive type located in a substrate of a first conductive type and parallel to and adjacent to each other, each memory cell further includes a gate structure located on the substrate and across the first doped region and the second doped region, the first doped region and the gate structure together form a depletion mode memory cell and the first doped region, the second doped region and the first gate structure together form an enhanced mode memory cell, and method comprising:

during erasing of the enhanced mode memory cell, applying a first voltage on the gate structure and grounding the first doped region and the second doped region to erase the enhanced mode memory cell in a way of Fowler-Nordheim tunneling effect; and during erasing of the depletion mode memory cell, applying a second voltage on the gate structure and grounding the first doped region to erase the depletion mode in the way of Fowler-Nordheim tunneling effect.

11. The method of claim 10, wherein a thickness of the first doped region is of about 200 angstroms and a thickness of the second doped region is of about 200 angstroms.

12. The method of claim 10, wherein the gate structure comprises a multi-carrier storage element located on the substrate and a gate located on the multi-carrier storage element.

13. The method of claim 12, wherein the multi-carrier storage element includes an oxide/nitride/oxide layer.

14. The method of claim 10, wherein, when the enhanced mode memory cell and the depletion mode memory cell are erased at the same time, the first voltage is equal to the second voltage.

\* \* \* \* \*